United States Patent [19]
Ogasawara et al.

[11] Patent Number: 5,923,034
[45] Date of Patent: Jul. 13, 1999

[54] PATTERN TRANSFER MASK, MASK INSPECTION METHOD AND A MASK INSPECTION APPARATUS

[75] Inventors: Munehiro Ogasawara, Fujisawa; Ken-ichi Murooka, Yokohama, both of Japan

[73] Assignee: Kabushiki Kaisha Toshiba, Kawasaki, Japan

[21] Appl. No.: 08/950,802

[22] Filed: Oct. 15, 1997

[30] Foreign Application Priority Data

Jan. 7, 1997 [JP] Japan ................................. 9-000759
Aug. 29, 1997 [JP] Japan ................................. 9-235127

[51] Int. Cl.[6] .................................................. H01J 37/256
[52] U.S. Cl. .................................... 250/311; 250/397
[58] Field of Search ................................ 250/311, 303, 250/397

[56] References Cited

U.S. PATENT DOCUMENTS

| | | | |
|---|---|---|---|
| 4,211,924 | 7/1980 | Muller et al. | 250/311 |
| 4,514,629 | 4/1985 | Smith et al. | 250/311 |
| 4,814,615 | 3/1989 | Fushimi et al. | 250/397 |
| 5,051,585 | 9/1991 | Koshishiba et al. | 250/311 |
| 5,457,317 | 10/1995 | Yonehara et al. | 250/311 |
| 5,555,315 | 9/1996 | Itakura | 382/141 |
| 5,578,821 | 11/1996 | Meisberger et al. | 250/311 |
| 5,717,204 | 2/1998 | Meisburger et al. | 250/310 |
| 5,717,207 | 2/1998 | Koguchi et al. | 250/397 |

FOREIGN PATENT DOCUMENTS

| | | |
|---|---|---|
| 63-266754 | 11/1988 | Japan . |
| 4-361544 | 12/1992 | Japan . |
| 5-258703 | 10/1993 | Japan . |

*Primary Examiner*—Bruce Anderson
*Attorney, Agent, or Firm*—Oblon, Spivak, McClelland, Maier & Neustadt, P.C.

[57] ABSTRACT

A mask inspection apparatus of the present invention includes an electron gun for irradiating an electron beam onto a mask with a pattern formed thereon, an electron lens for magnifying an electro-optic mask image passed through the mask, a fluorescent screen for converting the magnified electro-optic mask image to an optical mask image, an optical lens for optically magnifying the optical mask image, a detector for detecting the magnified optical mask image, and a comparator for inspection a defect in the pattern on the basis of the image. By doing so, it is possible to suppress aberrations resulting from the electro-optic magnification and, in addition, inspect the pattern with a high resolution through optical magnification. It is also possible to inspect the mask at its area and to inspect a defect at high speeds.

18 Claims, 5 Drawing Sheets

PATTERN TRANSFER MASK, MASK INSPECTION METHOD AND A MASK INSPECTION APPARATUS

BACKGROUND OF THE INVENTION

1. Field of the Invention

The present invention relates to a mask for use in transferring a very fine pattern of a semiconductor device with an X-ray or electron beam, a mask inspection apparatus and a mask inspection method.

2. Discussion of the Background

With a recent higher integration density of the semiconductor device, the circuit pattern of its associated LSI elements is more and more microminiaturized. For the microminiaturization of such a pattern it is required that not only its line width be narrowed but also the dimensional accuracy and positional accuracy be enhanced. In order to meet such requirements, the development of the associated exposure techniques have been rapidly progressed. Among these techniques, the exposure technique using the X-ray has been regarded as a promising technique of the next generation behind the current mainstream exposure technique using an ultraviolet radiation.

The currently developing X-ray exposure technique using a synchrotron radiation light provides an exposure system in which the light is conducted to a stepper through a mirror for enlarging an exposed area and a beam path constituted by a Be thin film, etc., serving as a vacuum partition wall and one-to-one proximity exposure is made using a 100%-magnification mask.

For the X-ray exposure light, therefore, a higher accuracy mask than the existing exposure-reducing mask using the ultraviolet radiation is required and a very stricter level of inspection is required. The mask inspection method using the existing ultraviolet light cannot solve the stricter conditions because of the resolution limit of an optical system. Therefore, a growing demand is made to develop a mask inspection method using a charged particle beam, such as an electron beam for obtaining a higher resolution.

Figure 1:
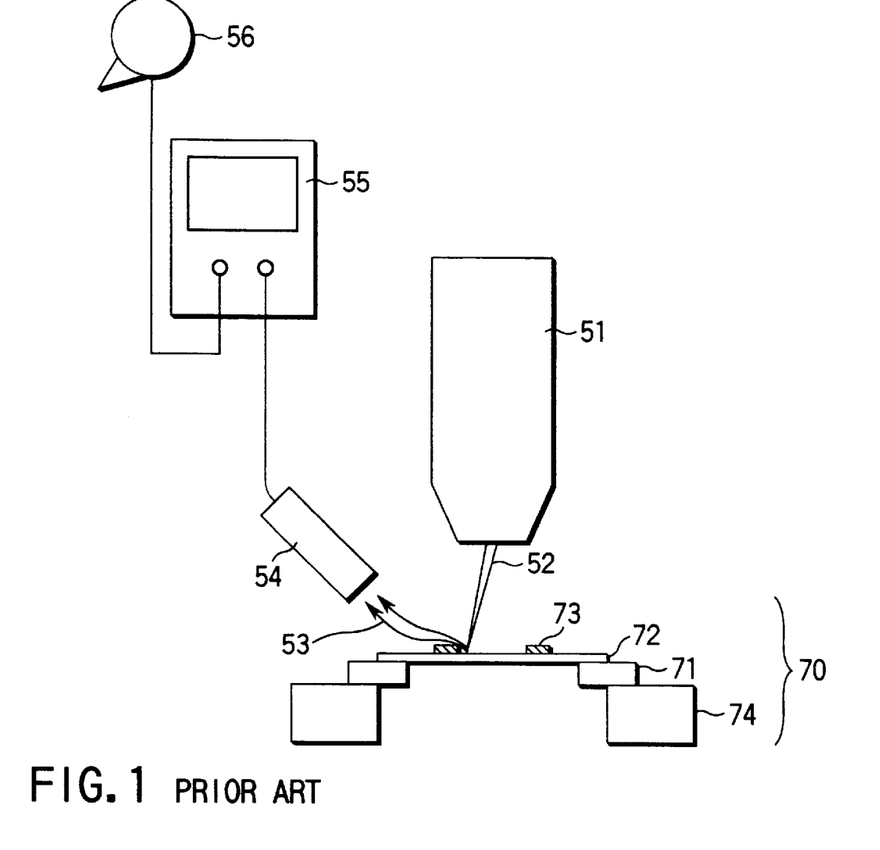
FIG. 1 is a view diagrammatically showing a conventional mask inspection apparatus.

FIG. 1 shows a general arrangement of the mask inspection apparatus. In this arrangement, an electron beam 52 is generated from an electron beam generator 51 and irradiated onto an X-ray mask 70. By doing so, secondary electrons are emitted from the surface of the X-ray mask 70. The secondary electrons are detected by a detector 54. A comparator 55 converts a pattern of the x-ray mask 70 to an image on the basis of the detection signal and compares it with mask data 56. By doing so, a pattern defect is picked up. Another method is also proposed for detecting a transmitted electron from the mask 10 instead of such secondary electrons and converting a pattern of the mask 70 to a corresponding image.

However, such an existing inspection method has the following problems. With the pattern microminiaturized, a defect is also microminiaturized. In order to pick up such a microdefect, the diameter of the electron beam has also to be micro-sized. It is, therefore, unavoidable that the inspection time, that is, the scanning time, over a whole mask is increased. It sometimes take 10 hours, for example, to inspect one sheet of a mask. Stated in easier terms, the inspection time becomes longer in proportion to one divided by a square of the beam size.

For the existing mask inspection apparatus primarily inspection the defects of the X-ray mask, it has taken a very long time to inspecting the mask in the case where more exact inspection has to be made on a micropattern.

In the case where the mask is checked with the use of an electron beam, the following problem also arises due to the structure of the X-ray mask. That is, the X-ray mask is so formed on a very thin film of 2 $\mu$m with an X-ray absorbing material corresponding to a transfer pattern formed thereon and has a small heat capacity. When, therefore, a charged particle beam for inspection is irradiated in a large quantity on the mask, an energy of the X-ray beam absorbed at a heat-directing area is converted to heat, thus causing a thermal deformation in the mask due to a rise in temperature there. As a result, some trouble occurs on inspection at a pattern coordinate. If an attempt is made to increase a current density so as to improve the throughput, contrast, S/N ratio, etc., in particular, an extremely great thermal deformation occurs in the mask, a state not practically tolerable in this case.

In the case where inspection is made on the X-ray mask with the use of a charged particle beam, such as an electron beam, there occurs a not-negligible event due to a heat generation resulting from an energy absorbed in the mask and an attendant thermal deformation there.

BRIEF SUMMARY OF THE INVENTION

An object of the present invention is to provide a mask inspection apparatus capable of inspection a mask with high accuracy.

Another object of the present invention is to provide a pattern transfer mask capable of realizing an adequate contrast even if a current density is suppressed so as to suppress a thermal deformation in a mask, a mask inspection method and an inspection apparatus.

Since the present invention is so arranged as to magnify a mask image with two systems, electro-optic and optical, it is possible to suppress aberration resulting from an electro-optic magnification and, in addition, to inspect, with a high resolution, a pattern through optical magnification. By doing so, it is possible to inspect the mask at its area and to inspect the defect at high speeds.

The present invention is so arranged as to eliminate elastic scattering beams mainly produced on the mask by aperture and it is, therefore, possible to provide a contrast through not only a loss intensity resulting from the inelastic scattering at the pattern but also an elastic scattering strength at the pattern.

The present invention satisfies a condition $$T_{a2} > T_{total} \geq 0.1 \times T_{a2}$$

where $T_{a2}$: the transmittance of a thin film by a charged particle beam for inspection; and $T_{total}$: the total transmittance of a combined thin film and pattern by the charged particle beam for inspection.

By doing so it is possible to secure an adequate contrast, reduce a heat generation quantity and suppress thermal deformation of a mask. It is also possible to secure the intensity of the elastic scattering electron, and adequately enhance a contrast, by satisfying a condition $$t/\xi_r > 0.1$$

where $\xi_r$: the extinction distance of the transmittance of the pattern; and t: the thickness of the pattern.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention, in which.

DETAILED DESCRIPTION OF THE INVENTION

As a preferred embodiment of the present invention an explanation will be given below about a mask inspection apparatus for inspection a mask with a charged particle beam. Here, an electron beam will be explained below by way of example. For a perforated stencil mask, use may be made of an ion beam, such as hydrogen or helium for inspection. Although, here, an X-ray mask is explained by way of example, use may be made of a mask for an electron beam for transferring.

Figure 2:
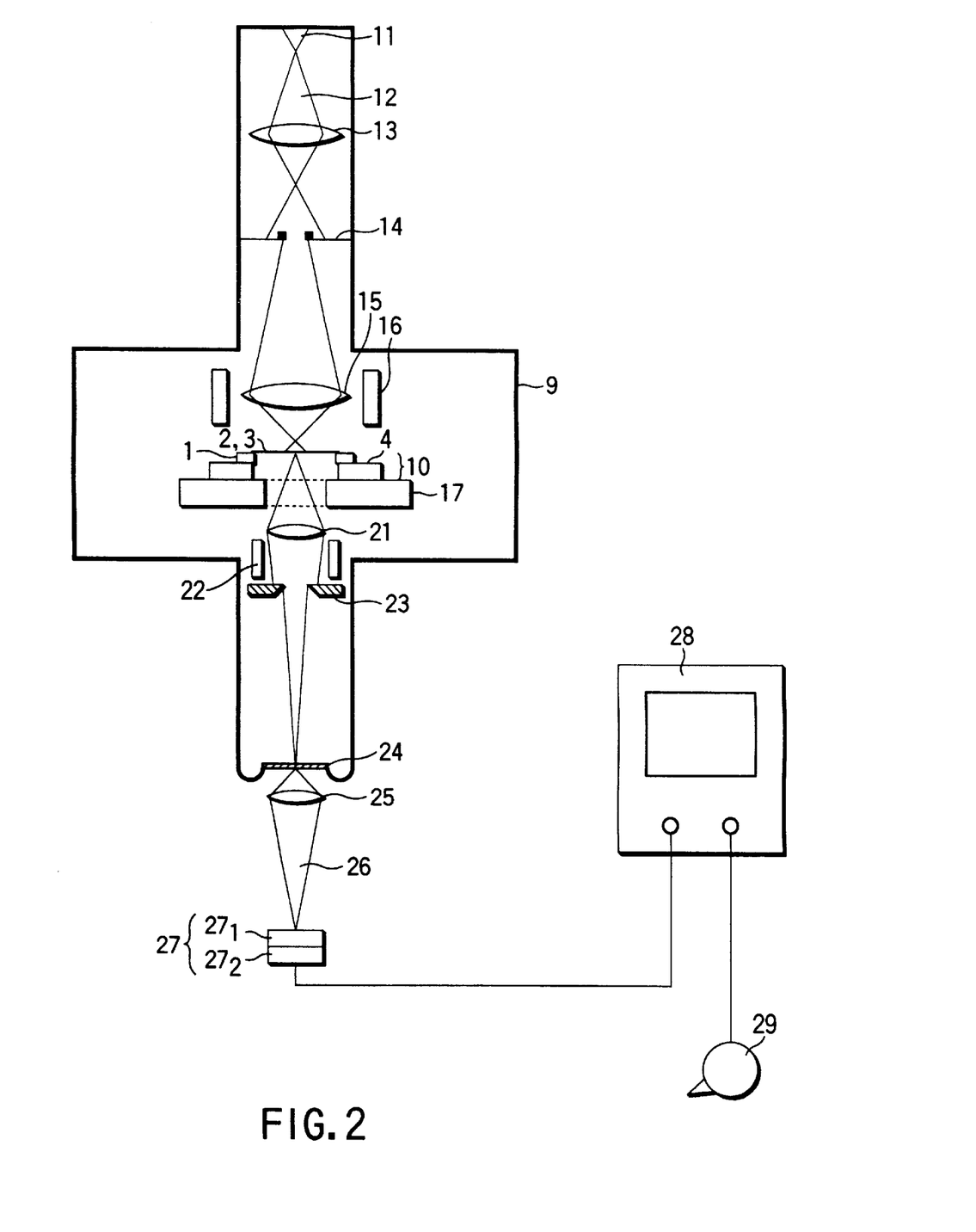
FIG. 2 is a view diagrammatically showing a mask inspection apparatus according to an embodiment of the present invention.

FIG. 2 is a diagrammatic view showing a mask inspection apparatus according to one embodiment of the present invention. An electron beam 12 is emitted from an electron gun 11 and condensed by a condenser lens 13 on a shaped mask 14 where it is shaped into a rectangular or linear shape. The shaped beam 12 is irradiated by an objective lens 15 onto an X-ray mask 15. A deflection coil 16 is so provided as to allow the X-ray mask 10 to be scanned with an electron beam 12.

Figure 3:
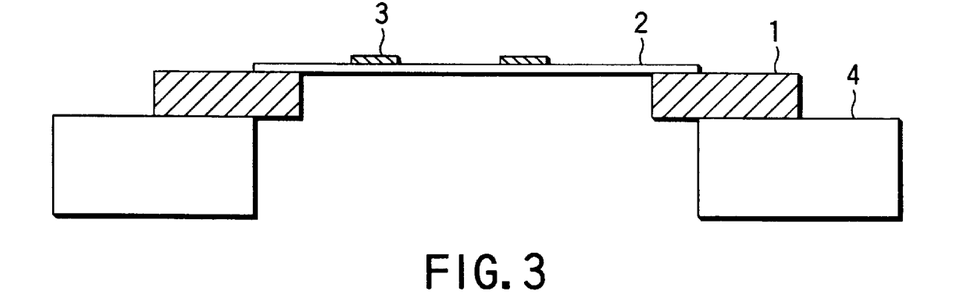
FIG. 3 is a cross-sectional view showing a pattern transfer mask.

The X-ray mask 10 comprises, as shown in FIG. 3, a wafer 1, a thin film (membrane) 2, such as SiN, deposited on the wafer 1 and relatively high in its transmittance relative to an X-ray and a pattern 3, such as Au, formed on the surface of the thin film 2 and relatively low in its transmittance relative to the X-ray. Here, reference numeral 4 shows a stationary frame for mounting the X-ray mask 10 on a mask stage 17. The detail of the X-ray mask 10 will be explained below.

The mask stage 17 is so provided as to be movable together with the deflection coil 12 in X and Y directions to allow the X-ray mask 10 to be scanned with an electron beam 12.

An electron lens 21 is so provided as to allow a shaded electro-optic mask image corresponding to the pattern 3 which has passed through the mask 10 to be magnified electro-optically. Further, a deflection coil 22 is so provided as to allow the correction of a center axis of the electro-optic mask image magnified by the electron lens 21 in the electron engineering manner.

The so magnified and corrected electro-optic mask image is formed on a fluorescent screen 24 past an aperture 23. The aperture 23 is located at a focal point of the electron lens 21 to cut off, and eliminate, most of the electrons elastically scattered at the mask 10 and varied in their flight direction.

The electro-optic mask image is converted by the fluorescent screen 24 to an optical mask image. The optical mask image is optically magnified by an optical lens 25 and converted to an image signal by a detector 27 comprised of a combination of, for example, a microchannel plate $27_1$ and CCD camera $27_2$.

The electron gun 11, condenser lens 13, shaped mask 14, objective lens 15, deflection coil 16, mask stage 17, electron lens 21, deflection coil 22, aperture 23, etc., as set out above are held within a tube 9 of a high-hermetic seal capable of maintaining an inside in a vacuum state. The fluorescent screen 24 is used as a vacuum barrier for the tube 9.

Figure 4:
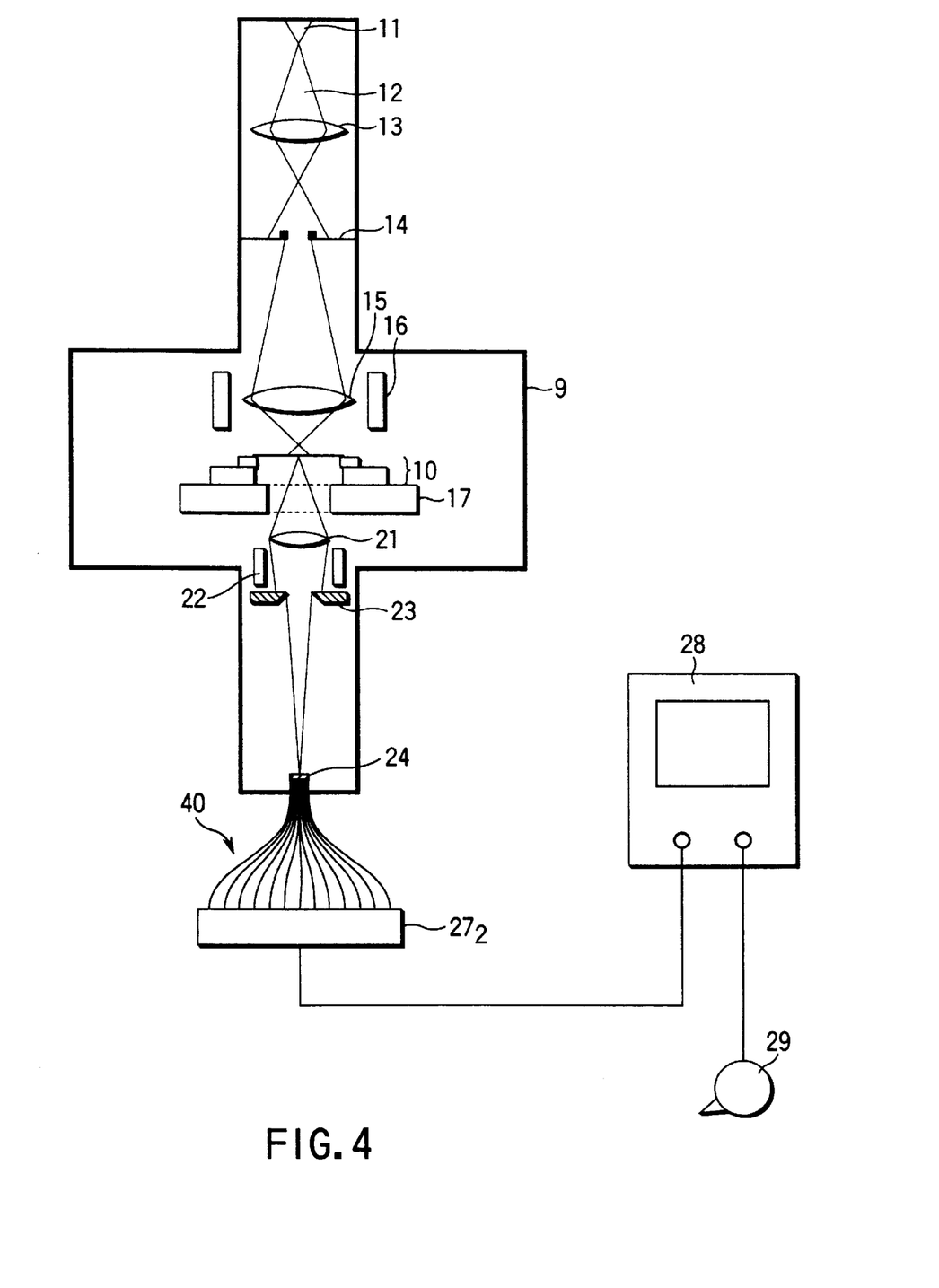
FIG. 4 is a view diagrammatically showing a mask inspection apparatus using an optical fiber bundle in place of an optical lens in FIG. 2.

In place of the optical lens 25 use may be made of, as an optically magnifying means, an optical fiber bundle 40 thicker at a rear end than at a front end as shown in FIG. 4. The optical fiber bundle 40 is optically contacted at its forward ends with the fluorescent screen 24 and at its rear end with a light receiving surface of the CCD camera $27_2$. In this connection it is to be noted that, instead of the fluorescent screen 24, a fluorescent material may be coated on the forward end surface of the optical fiber bundle 40 or a scintillator material be mounted there. In this case, the function of the vacuum barrier possessed by the fluorescent screen 24 can be possessed by the optical fiber bundle 40 stronger in rigidity than the fluorescent screen 24.

One of the important aspects of the present invention lies in that the mask image is magnified by two systems, electro-optic and optical. The reason for magnifying the mask image by these two systems is as follows.

The magnification of the mask image is done so as to enable a defect on a to-be-inspected object to be picked up with the resolution of the detector 27 governed by a lower one of the resolution of the CCD camera $27_2$ and that of microchannel plate $27_1$. Here, a required total magnification percentage is set to be 10,000 times for ease in understanding. Now let it be assumed that the electro-optic mask image is electro-optically magnified up to 10,000 times without being optically magnified. In this case, the aberration becomes too great and a pattern defect is buried in a blurred area resulting from the aberration.

Let it be assumed that the mask image is optically magnified up to 10,000 times without being electro-optically magnified. In this case, an electro-optic mask image equal in magnification to the mask is projected onto the fluorescent screen 24. For this reason, a microdefect smaller than the wavelength of light completely disappears on the optical mask image output from the fluorescent screen 24.

This is the reason why the mask image is magnified by the two systems, electro-optic and optical. Next, the percentage of magnification by the electro-optic system and optical system will be explained below. If the defect is greater than a given size, the mask is rejected as being defective by the mask inspection. That is, the defect greater than the given size is handled as an object to be inspected and it is not necessary to inspect a size below this given size. The defect size under such mask inspection, that is, the good/defective border size, is clearly decided.

In order to pick up the defect, having the border size, with a resolution of the detector 27 for the above-mentioned magnification purpose, it is required that the size of the defect image magnified by the two systems is greater than the resolution of the detector 27. The percentage of total magnification by the electron lens 21 and optical lens 25 can be freely decided with a magnification percentage, that is, a percentage obtained by dividing the resolution of the detector 27 by the actual border size of the defect, used as a lower limit.

Further, the percentage of the magnification by the electronic lens 21 can be freely decided in a range between an upper limit of a magnification percentage at which the aberration is held within a predetermined allowable range and a lower limit of a magnification percentage at which the border size of the defect image projected on the fluorescent screen 24 becomes at least greater than the wavelength of the light. Finally, the optical magnification percentage is determined by both the total magnification percentage and the magnification percentage of the electron lens 21, that is, the magnification percentage at which the border size of the picked up defect on the mask image projected on the detector 27 is greater than the resolution of the detector 27 is determined as a lower limit.

In the case where the total magnification is set to be 10,000 times with the above-mentioned conditions taken into consideration, for example, the magnification percentage of the electron lens 21 becomes about 1,000 times and the magnification percentage of the optical lens 25 becomes about 10 times.

Figures 5, 6:
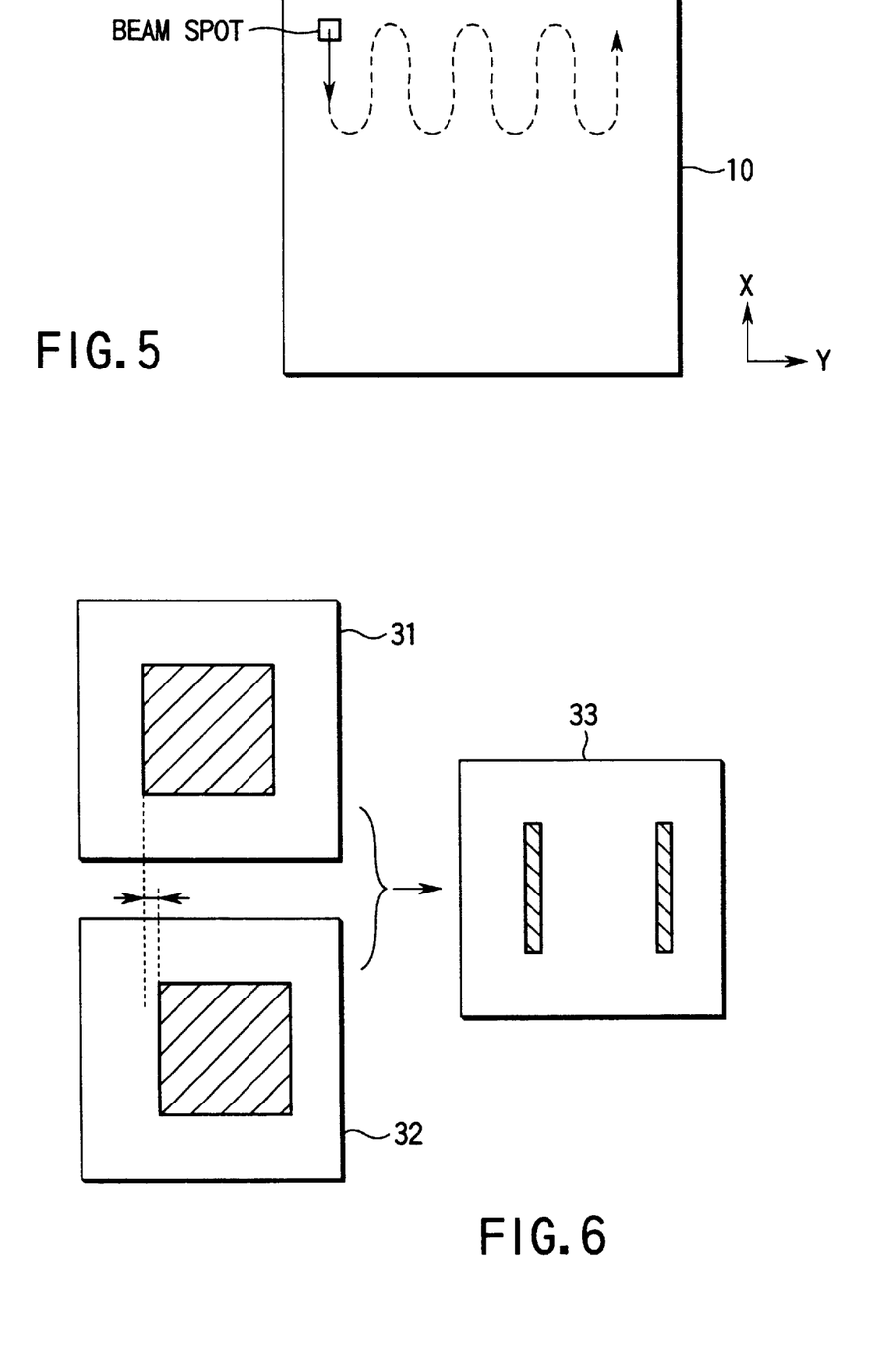
FIG. 5 is a view showing on example of the deflection of electron beams by a deflection coil in FIG. 2.
FIG. 6 is an explanatory view showing edge-enhance-processing of a comparator in FIG. 2.

The mask image magnified at such magnification percentage is converted by the detector 27 to an image signal. The image signal is sent to a comparator 28. In order to obtain a whole mask image, it is necessary to scan the mask 10 with an electron beam, as shown in FIG. 5, under a cooperation of the stage 17 with the deflection coil 16. There are two scanning methods, one for intermittently moving a beam on the mask 10 and the other for continuously moving a beam on the mask 10. In the former method, image signals may be sequentially written into corresponding areas of a frame memory in the comparator 28. In the latter case, an image signal may be obtained through a time integration at an area.

At this time, the magnetic excitation strength of the objective lens 15 and the magnetic excitation of the magnifying lens 21 are varied in accordance with the scanning of a shaped beam 30 and, at the same time, those electron beams passed through the mask 10 and not scattered at the mask 10 are so adjusted as to pass through the center of the aperture 23, so that it is possible to suppress the blurring of the beams resulting from the deflection. By doing so, a large area can be inspected for a short time without raising the moving speed of the stage 17.

Without a continuous movement of the stage 17, a step and repeat system can be used according to which a beam is deflected and, after the inspection of a deflected area, the stage 17 is moved.

The whole image of the mask 10 thus obtained is compared by the comparator 28 with master data, that is, design data, and it is possible to pick up a defect. It is preferred that, as pre-processing for comparison, the edge of the pattern be enhanced through a time differentiation. This spatial differentiation may be done through a space filter, but, for processing efficiency, an original image 31 and shift image 32 obtained by shifting the original image 31 by a beam resolution level in a stage moving direction are subjected to subtracting between their frames as shown in FIG. 6. By doing so it is possible to obtain a difference image 33 with only a high spatial frequency's edge enhanced. From this difference image 33 a three-leveled (1, 0, −1) image is obtained depending upon the level of an initially set value. The levels 1, −1, on the ternary image correspond to the edge of the pattern. Defect detection can be made by comparing the ternary image with the differential data of master data 29.

It is possible to not only obtain the differential image 33 through the space filter but also to obtain an image with a relatively high spatial frequency's edge enhanced by the detector 27 in which case the space filter is arranged at the focal position of the optical lens 25 to allow the transmittance of the spatial frequency's low components from the optical image to be lowered.

According to the present embodiment, through the joint use of the magnification of the electron lens 21 and that of the optical lens 25, it is possible to form a magnified image of better resolution and hence to realize high-precision inspection. Further, the mask 10 can be area-inspected for defect and defects inspection can be made at high speeds. By providing the aperture 23, many more beams elastically scattered at the mask 10 can be cut off to achieve an enhanced contrast and hence improve inspection accuracy.

An explanation will be given below about the contrast characteristic of the mask inspection apparatus according to the present invention.

Figure 7A:
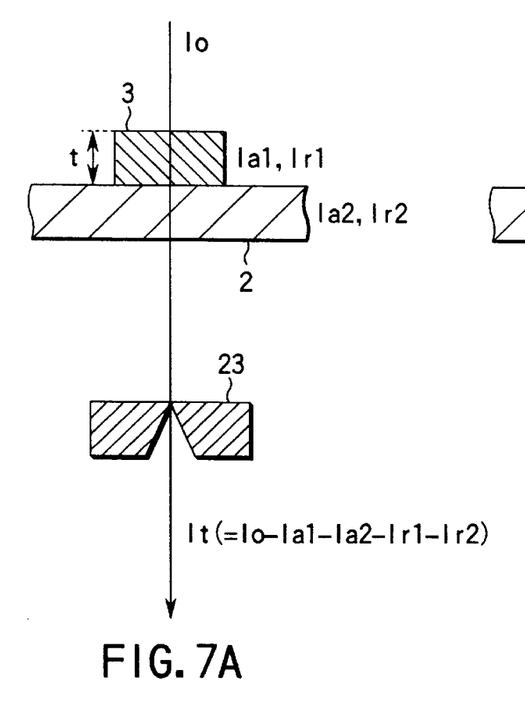
FIG. 7A is a view showing a variation in strength of an electron beam transmitted through a pattern area on a thin film in FIG. 3.
Figure 7B:
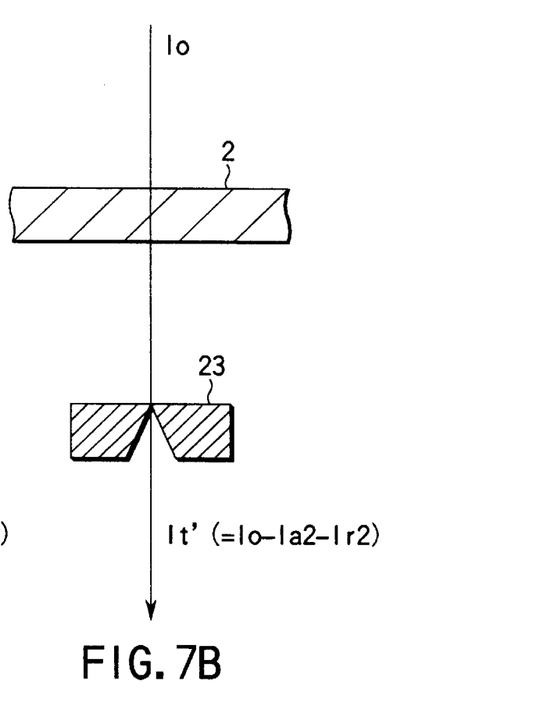
FIG. 7B is a view showing a variation in strength of an electron beam transmitted through an area of a thin film where no pattern is formed.
Figure 8:
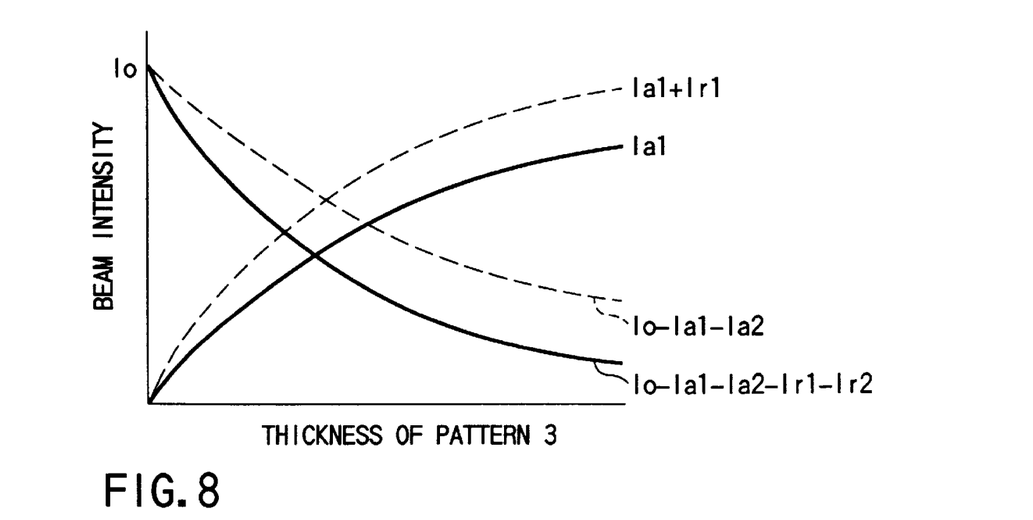
FIG. 8 is a view showing a comparison between a contrast factor of the present invention and that of the prior art.

FIG. 7A shows a variation in intensity of an electron beam in the case where the beam is passed through the pattern 3 and thin film 2, and FIG. 7B shows a variation in intensity of the beam in the case where the beam passes through the thin film 2 only. FIG. 8 shows a comparison between a pattern thickness dependence relating to the strength of an electron beam detected by the detector 27 after it has been passed through the pattern 3 at the mask 10, that is, through the pattern 3 and thin film 2 and a pattern thickness dependance relating to the contrast factor, that is, a comparison between the prior art and the present invention in terms of these dependances.

Many electrons of over a few KeV used for mask inspection generate heat due to their inelastic scattering and the remaining electrons pass through the pattern 3 and thin film 2. Some of the passed electrons have their energies conserved by their elastic scattering and change in their flying direction. The other passed electrons have their energies conserved and do not change in their flying direction. Here, "$I_o$" represents the radiation intensity of the electron beam; "$I_{a1}$", a loss intensity resulting from an inelastic scattering at the pattern 3; "$I_{a2}$", a loss intensity resulting from the inelastic scattering at the thin film 2; "$I_{r1}$", the intensity of electrons elastically scattered on the pattern 3; and "$I_{r2}$", the intensity of electrons elastically scattered on the thin film 2. And the transmittance of the pattern 3 and that of the thin film 2 are represented by "$T_{a1}$" and $T_{a2}$, respectively. In this connection it is to be noted that the transmittance is given by a ratio of the intensity of passed (transmitted) electrons to the intensity of incident electrons and, in this case, the intensity of the passed electrons includes the intensity of straight passed electrons suffering neither an elastic nor an inelastic scattering as well as the intensity of the elastically scattered electrons.

In the prior art technique, the intensity of electrons detected by the detector 27 after they have been transmitted through the area of the pattern 3 at the mask 10, that is, through both the pattern 3 and thin film 2, is given by "$I_o - I_{a1} - I_{a2}$". On the other hand, the intensity of electrons detected by the detector 27 after they have been transmitted through the area not having the pattern 3, that is, through the thin film 2 only, is given by "$I_o - I_{a2}$". Thus, the conventional contrast factor is given by the loss intensity "$I_{a1}$" resulting form the inelastic scattering at the pattern 3.

According to the present invention, on the other hand, since most of those elastically scattered beams are eliminated by the aperture 23, the intensity of electrons detected by the detector 27 after being transmitted through the area of the pattern 10 at the mask 10, that is, through both the pattern 3 and thin film 2, is given by "$I_o - I_{a1} - I_{a2} - I_{r1} - I_{r2}$".

while the intensity of electrons detected by the detector 27 after being transmitted through the area not having the pattern 3, that is, through the thin film 2 only, is given by "$I_o - I_{a2} - I_{r2}$".

Thus the contrast factor of the present embodiment is given by "$I_{a1} + I_{r1}$", that is, the loss intensity "$I_{a1}$" resulting from the inelastic scattering at the pattern 3 plus the intensity of electrons suffering elastic scattering at the pattern 3.

In this way, with the intensity of irradiation, $I_o$, given to be equal, the contrast is enhanced by the intensity $I_{r1}$ according to the present embodiment compared to the prior art. Stated in a reverse way, according to the present embodiment, even if the irradiation intensity is lower than in the prior art, it is possible to obtain the same contrast as in the prior art. Thus, the intensities "$I_{a1}$" and "$I_{a2}$" of electrons causing the inelastic scattering can be lowered to reduce a heat generating quantity and suppress the deformation of the mask resulting from the heat generation.

In order to effectively utilize the contrast factor excellent over the conventional counterpart, it is preferable to determine the nature of the inspection electron beams and of the mask 10 under the following conditions. That is, in order to reduce the heat generation quantity a smaller level of "$I_{a1}$" is better but too small a level is not better so as to secure a contrast of some extent. For the contrast to be improved the intensity "$I_{r1}$" is required to have above a certain extent.

Taking these into consideration, the loss intensity "$I_{a1}$" resulting from inelastic scattering at the pattern 3 is set to be preferably below "$0.9 \times I_o$"–condition (1)–and the intensity "$I_{r1}$" resulting from elastic scattering of electrons on the pattern 3 is set to be preferably above "$0.1 \times I_o$"–condition (2)–.

First, an explanation will be given below about a simplified equation to satisfy the condition (1). Here, the transmittance of the beam through the pattern 3 and thin film 2 is given as "$I_{total}$" below.

$I_{total} = I_{a1} \times T_{a2}$

Here, $T_{a1} = (I_o - I_{a1})/I_o = 1 - (I_{a1}/I_o)$

Since the condition (1) means "$(I_{a1}/I_o) < 0.9$"

$T_{a2} > T_{total} > 0.1 \times T_{a2}$ as a final form of conditional equation.

The mask 10 can be so designed as to satisfy the condition (1) from the relatively-easy-to-measure transmittance "$T_{a2}$" of the thin film 2 and relatively-easy-to-measure transmittance "$T_{total}$" of beams transmitted through the pattern 3 and thin film 2, noting that, in this case, the relatively-hard-to-measure transmittance "$T_{a1}$" of the pattern 3 is eliminated from the conditional equation. The transmittance can be adequately accurately found, in place of being actually measured, through a calculation using an approximation equation described on K. Kana and S. Okayama; J. Phys. D: Apple. Phys., Vol. 5, 1972 PP 43–58.

An explanation will be given below about the simplified conditional equation for satisfying the condition (2). The intensity "$I_{r1}$" of the elastically scattered electrons at the aperture 23, more accurately, the intensity of the elastically scattered electrons, is eliminated at the aperture 23 and it is easier to formulate it with an extinction distance "$\xi_r$". The extinction distance "$\xi_r$" means a quantity inversely proportional to a probability of the incident electrons being subject to elastic scattering and, disregarding the other interaction, the following relation (1) is established.

$$\frac{d I_{rl}}{d t} = \frac{I_t}{\xi_r} \tag{1}$$

where "t" denotes the thickness of the pattern 3 and "$I_t$" the intensity of electrons transmitted through the pattern.

As well known in the art, "$I_t$" varies exponentially with respect to the thickness "t" and Equation (1) can be reduced to $$I_{rl} = I_o \frac{1}{k\xi}(1 \exp(kt)) \tag{2}$$

Here, if "$I_{r1}$" is not too large, that is, the exponential function portion is approximate to 1, Equation (2) can be approximate to the following Equation (3)

$$I_{rl} \simeq I_o \frac{t}{\xi_r} \tag{3}$$

Since the condition (2) above is "$I_{r1} > 0.1 \times I_o$, Equation (3) can be simplified, from the extinction distance "$\xi_r$" and the thickness "t" of the pattern 3, to:

$$t/\xi_r > 0.1 \tag{4}$$

Although the extinction distance "$\xi_r$" depends upon the material of an absorbing body and crystal structure, if the crystal structure is amorphous or microcrystal, the distance can be calculated based on the method described on [Lugwig Reimer; "transmission Electron Microscopy" Springer-Verlog 1984 pp. 186 to 192] and, through the table forms and conversion of the units, it is possible to obtain desired numerical values. For larger crystal grains and single crystal, the calculation method and results of the extinction distance "$\xi_r$" are described in [P. B. Hirsch et al.; "electron Microscopy of Thin Crystals" BUTTER WORTH 1965 APPENDIX 4, pp. 495–497"], etc., and can be utilized. For a larger "$I_{r1}$", the effect of multiple scattering emerges, thus failing to apply the equations above. In the sense of finding an adequate condition for satisfying "$I_{r1} > 0.1 \times I_o$", it is only necessary to satisfy "$t/\xi_r > 0.1$" so that there is no inconvenience.

Now an explanation will be given below about this aspect in more detail.

The mask 10 is of such a type that a Ta pattern 3 of 0.4 µm thick is described on an SiC thin film 2 of 0.2 µm. When electron beams of 20 KeV are incident on such mask 10, about 73% of the electrons are inelastically scattered on the thin film 2 and, through such a loss, 27% of electrons are transmitted through the thin film 2. Of the 27% electrons, about 90% of the electrons are inelastically scattered at the pattern 3 to suffer a loss. That is, $T_{a2}=0.27$, $T_{a1}=0.027=0.1 \times T_{a2}$. It is evident that, since the extinction distance of the transmittance $T_{a1}$ of the pattern 3 by electrons of 20 KeV is below 0.1 μm, when electrons are transmitted through the pattern 3 of 0.4 μm thick, several tens of the electrons undergo elastic scattering. The reason why the sum of the loss intensity by the inelastic scattering and intensity of the elastically scattered electrons exceeds 100% is because some of the elastically scattered electrons are inelastically scattered due to the multiple scattering.

According to the present embodiment, the thermal deformation of the mask can be reduced in comparison with the case where inspection is made, under a greater absorbing condition, with the use of those electron beams of low acceration voltage as in the prior art. In addition, the lowering of a contrast resulting from the lowering of the absorption can be compensated for by the intensity of the elastically scattered electrons, so that it is possible to achieve high accurate inspection with high accuracy.

The present invention is not restricted to the above-mentioned embodiments. Various changes and modifications can be made without departing from the spirit and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

We claim:

1. A mask inspection apparatus comprising:
   a charged particle beam generating source for irradiating a charged particle beam;
   a shaped mask for shaping the charged particle beam to generate a shaped charged particle beam, the shaped charged particle beam being applied onto a mask formed with a pattern;
   an electron lens for electro-optically magnifying an electro-optic mask image transmitted through the mask;
   a fluorescent screen for converting the magnified electro-optic mask image to an optical mask image;
   optically magnifying means for optically magnifying the optical mask image;
   a camera for detecting a magnified optical mask image to obtain an image signal; and
   means for inspecting the pattern for a defect on the basis of the image signal.

2. The mask inspection apparatus according to claim 1, wherein the electron lens magnifies the electro-optic mask image until the minimum size of a picked defect on the electro-optic mask image is brought to an extent at least greater than the wavelength of light.

3. The mask inspection apparatus according to claim 1, wherein the electron lens and optically magnifying means magnify the electro-optic mask image and optical mask image until the minimum size of a picked defect on the magnified optical mask image is brought to an extent greater than a resolution of the camera.

4. The mask inspection apparatus according to claim 1, wherein the optically magnifying means magnifies the optical mask image until the minimum size of a picked defect on the optical mask image is brought to an extent greater than a resolution of the camera.

5. The mask inspection apparatus according to claim 1, further comprising an aperture arranged between the electron lens and the fluorescent screen to eliminate at least a portions of a scattering component contained in the electro-optic mask image.

6. The mask inspection apparatus according to claim 5, wherein the aperture is arranged at a focal position of the electronic lens.

7. The mask inspection apparatus according to claim 1, further comprising a deflection coil for deflecting the charged particle beam to allow the mask to be scanned with the charged particle beam.

8. The mask inspection apparatus according to claim 1, further comprising a mechanism for moving the mask to allow the mask to be scanned with the charged particle beam.

9. The mask inspection apparatus according to claim 1, wherein the inspection means has means for spatially differentiating the image signal to enhance the edge of the pattern.

10. The mask inspection apparatus according to claim 9, wherein the differentiating means has means for shifting the image signal and means for subtracting a frame of the shifted image signal from a frame of the non-shifted image signal.

11. The mask inspection apparatus according to claim 1, further comprising an optical filter arranged between the optically magnifying means and the camera to enhance the edge of the pattern in the magnified optical mask image.

12. The mask inspection apparatus according to claim 1, wherein the optical filter is arranged at a focal position of the optically magnifying means.

13. The mask inspection apparatus according to claim 1, wherein the charged particle beam generating means, the mask and the electron lens are held in a vacuum and the fluorescent screen is used for a vacuum barrier.

14. The mask inspection apparatus according to claim 1, wherein the optically magnifying means is comprised of an optical lens.

15. The mask inspection apparatus according to claim 1, wherein the optically magnifying means is comprised of an optical fiber bundle formed thicker at a rear end than at a forward end.

16. The mask inspection apparatus according to claim 15, wherein the forward end surface of the optical fiber bundle is coated with a fluorescent substance.

17. The mask inspection apparatus according to claim 15, wherein the charged particle beam generating source, the mask, the electron lens and the fluorescent screen are held in a vacuum and the optical fiber bundle is used for a vacuum barrier.

18. A mask inspection apparatus comprising:
   a charged particle beam generating source for irradiating a charged particle beam;
   a shaped mask for shaping the charged particle beam to generate a shaped charged particle beam, the shaped charged particle beam being applied onto a mask formed with a pattern;
   an aperture for eliminating at least a portion of a scattering beam from an electro-optic mask image, passed through the mask, with a shade corresponding to the pattern formed there; and
   means for inspecting a defect in the pattern on the basis of the eliminated electro-optic mask image.

* * * * *